United States Patent
Seki et al.

[19]

[11] Patent Number: 6,043,499
[45] Date of Patent: Mar. 28, 2000

[54] CHARGE-UP PREVENTION METHOD AND ION IMPLANTING APPARATUS

[75] Inventors: Takayoshi Seki, Hitachi; Katsumi Tokiguchi, Mito, both of Japan

[73] Assignee: Hitachi, Ltd., Tokyo, Japan

[21] Appl. No.: 09/054,496

[22] Filed: Apr. 3, 1998

[30] Foreign Application Priority Data

Apr. 11, 1997  [JP]  Japan ................................ 9-093431

[51] Int. Cl.⁷ .................................................. H01J 37/304
[52] U.S. Cl. ........................................ 250/492.21; 250/397
[58] Field of Search ............................ 250/492.21, 397

[56] References Cited

U.S. PATENT DOCUMENTS

| | | | |
|---|---|---|---|
| 4,675,530 | 6/1987 | Rose et al. ...................... | 250/492.21 |
| 5,126,576 | 6/1992 | Wauk, II et al. ................. | 250/492.21 |
| 5,326,980 | 7/1994 | Tajima et al. .................... | 250/397 |
| 5,466,929 | 11/1995 | Sakai et al. ..................... | 250/492.21 |

*Primary Examiner*—Jack Berman
*Attorney, Agent, or Firm*—Beall Law Offices

[57] ABSTRACT

A charge-up prevention method for use when ion beams are implanted simultaneously with electrons, prevents charge-up on a plurality of objects to be irradiated. A supply quantity of electrons is controlled while directly measuring the potential of the objects that are to be irradiated, and an ion implanting apparatus which irradiates ion beams onto objects which are arranged in a circular shape and moving while rotating, includes an electron source irradiating simultaneously ion beams and electrons for charge prevention, and a controller for controlling a supply quantity of electrons while directly measuring the potential of objects to be irradiated.

10 Claims, 5 Drawing Sheets

MICRO WAVE

CHARGE-UP PREVENTION METHOD AND ION IMPLANTING APPARATUS

BACKGROUND OF THE INVENTION

The present invention relates to a method preventing charge-up in of objects to be irradiated in an apparatus utilizing ion beams and an ion implanting apparatus and, more particularly, to a charge-up prevention method which is effective for preventing wafers from charging in a heavy current ion implanting apparatus.

In this paper, an object to be irradiated is referred to as an irradiating object.

In conventional measurement of a charging quantity on a wafer, a charge up monitor in which a non-contact gauge head is disposed on a side opposite to a measuring object has been used. The charge up monitor is mounted for use on an opposite side of one of a plurality of (usually circularly arranged) wafers which is receiving beams thereon. A quantity of charge on a wafer increases when beams are being impinged, and decreases as the wafer goes away from the beams by rotation of the wafers. Therefore, the quantity of charge at the position at which beams are really impinging cannot be measured, so that there was a problem that a precise amount of electrons for neutralization cannot be supplied by the conventional method. Furthermore, there has been a problem that the conventional measuring method could not be used for an irradiating object or objects to be treated under a high temperature. This is because the charge quantity measuring equipment cannot be generally used under a high temperature condition over a few hundred °C.

One method of forming implanted oxide films in silicon wafers is SIMOX (Separation by Implanted Oxygen) implanting oxygen ions at a high dose level. In implanting equipment realizing this implanting method, high electric-current oxygen ion beams of 50–70 mA at 120–200 keV are implanted while heating a wafer to a temperature of 500° C. or more. Therefore, the wafer is charged by ion beams, and electric breakdown occurs between the wafer and a holder mounting the wafer thereon. Thus, the charge-up phenomena has resulted in a cause of generating particles due to the electric breakdown.

SUMMARY OF THE INVENTION

An object of the present invention is to prevent irradiating objects from being charged by measuring a charge quantity on the irradiating objects when ion beams are being impinged and supplying a precise amount of neutralizing electrons.

Another object of the present invention is to provide a charge prevention method and an ion implanting apparatus each of which is able to be used at a high temperature of 500° C. or higher.

The present invention for achieving the above object or objects is characterized by controlling the quantity of electrons to be supplied while directly measuring the potential of one irradiating object or several irradiating objects by using a dummy wafer.

DESCRIPTION OF EMBODIMENT OF THE INVENTION

Figure 1:
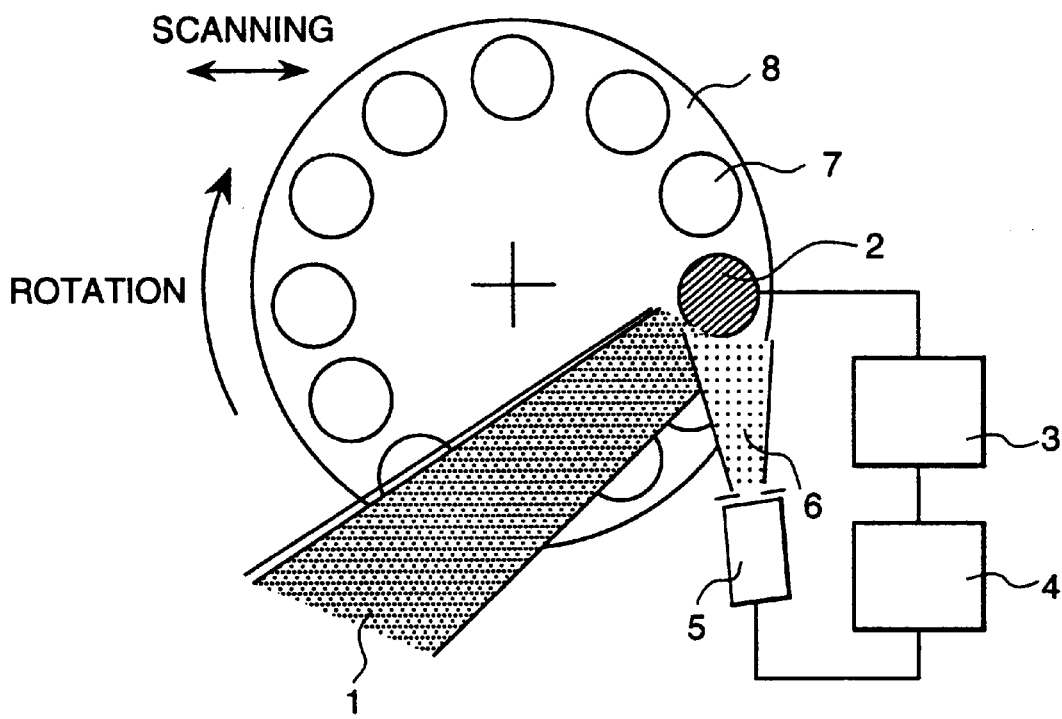
FIG. 1 is a schematic diagram of an ion implanting apparatus to which an embodiment of the present invention is applied.

An embodiment of the invention will be described hereunder, referring to the drawings.

FIG. 1 is a schematic diagram showing an ion implanting apparatus of an embodiment of the present invention. The ion implanting apparatus shown in FIG. 1 comprises a circular disc 8, wafers 7, a dummy wafer 2, a surface electrometer 3 for potential measurement, and an electron source current controller 4 of an electron source 5 for electron discharge.

The wafers 7 and the dummy wafer 2 with a lead wire are mounted on the peripheral portion of the disc 8, rotate with the disc 8, and move for scanning. Ion beams 1 are irradiated onto the wafers 7 and the dummy wafer 2, and the quantity of charge at this time is measured by the surface electrometer 3 for potential measurement, an amount of electrons emitted from the electron source 5 is adjusted by the electron source current controller 4, whereby the quantity of neutralizing electrons 6 is controlled. This is repeatedly conducted to control the potential of the wafers 7 so as to be 20 V or lower. Although one dummy wafer 2 can achieve its purpose, mounting for use of a plurality of dummy wafers improves control precision of electron current.

Figure 2:
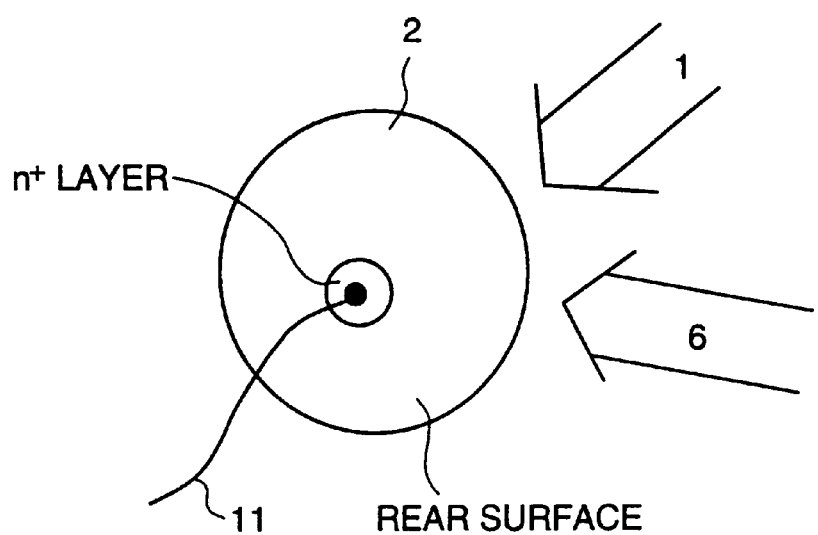
FIG. 2 is a schematic diagram for explaining a lead wire mounting method of a dummy wafer.

FIG. 2 shows an example of the dummy wafer. The dummy wafer 2 is an n-type wafer and an $n^+$ layer is formed in part in the rear surface of the n type wafer 2, whereby it is made so that sure adhesion can be effected by ohmic contact. A metal lead wire 11 is mounted on the $n^+$ layer portion.

Figure 3:
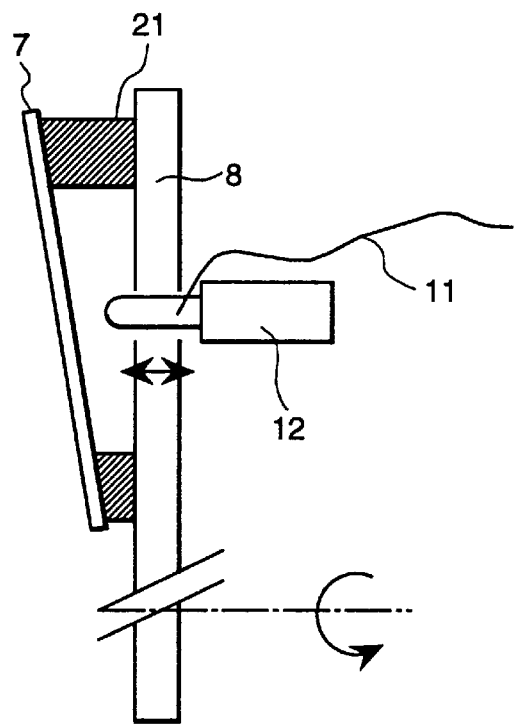
FIG. 3 is a schematic diagram for explaining a lead wire mounting method using a silicon system.

FIG. 3 shows a construction for measurement without using any dummy wafer. In this construction, a cylinder 12 having a plunger moving up and down and having a lead wire 11 mounted thereon is provided under the disc 8. The cylinder 12 is moved at the plunger after rotation of the disc 8 causes the cylinder to contact the wafer 7. The cylinder 12 is driven under the condition that a wafer holder 21 is pressed on the disc by centrifugal force. The pressing force of the cylinder 12 is made smaller than the centrifugal force caused by rotation, taking into consideration the wafer 7 being fallen therefrom.

Figure 4:
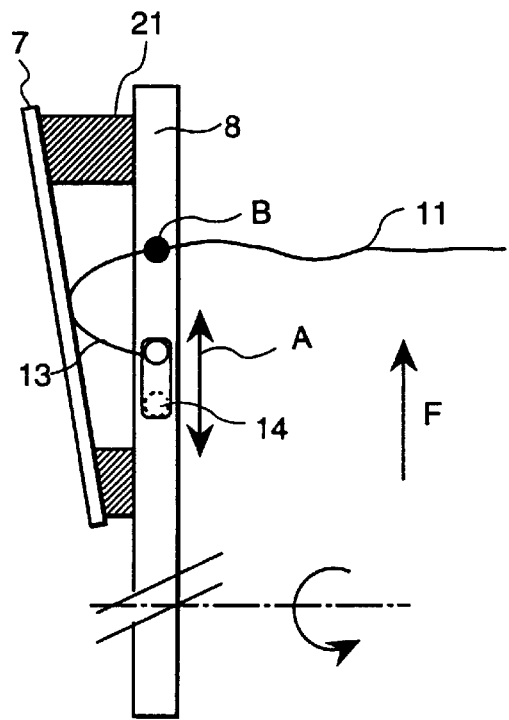
FIG. 4 is a schematic diagram for explaining a lead wire mounting method using a spring.

FIG. 4 shows another method of contacting the lead wire 11 with the wafer 7.

In FIG. 4, a spring 13 is mounted on the disc 8.

The spring 13 has one end pivotable about a point B of the disc 8 and the other end having a weight 14 which is freely movable in a region A. Rotation of the disc 8 causes centrifugal force F, and the weight 14 is shifted outside of the disc 8, whereby the spring 13 is bent and a part of the spring 13 is contacted with the wafer 7 so that measurement can be effected through the lead wire 11.

Figure 5:
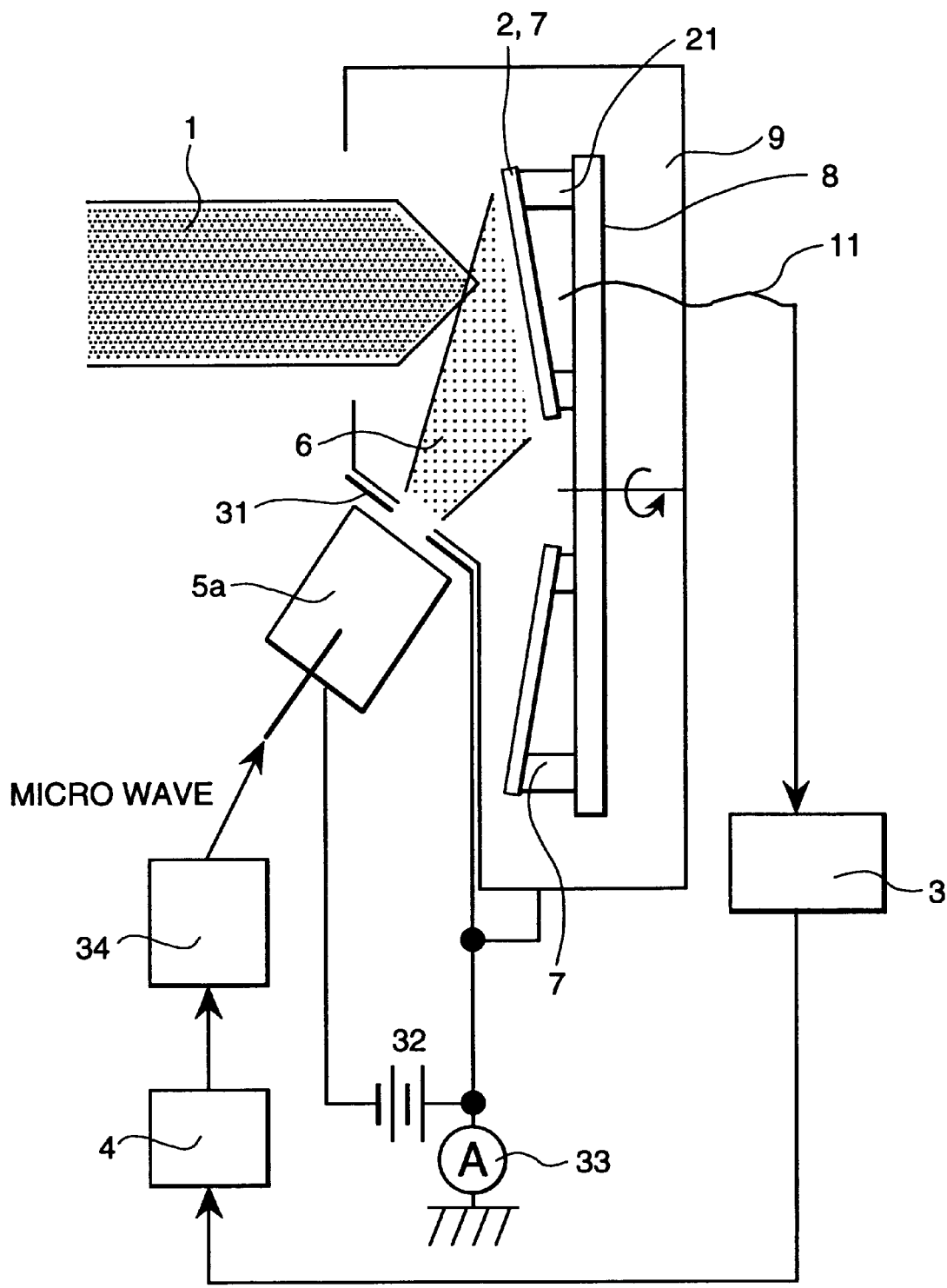
FIG. 5 is a schematic diagram of an example of an ion implanting apparatus in which a plasma type electron source is used.

FIG. 5 shows a construction of an ion planting apparatus in which electrons generated by plasma are used.

In FIG. 5, the lead wire 11 mounted on the dummy wafer 2 is led out from vacuum of a Faraday cup 9 into atmosphere and connected to the surface electrometer 3 to measure there the potential of the dummy wafer 2. The measured value is transferred to a microwave generator 34 through the electron source electron quantity controller 4 to adjust the microwave electric power, and to control the quantity of electrons 6 emitted from a plasma type electron source 5a by a electrode 31. Although not shown in FIG. 5, the quantity of electrons 6 can be controlled by adjusting the voltage of a power source 32 for emitted electrons according to output from the controller 4 instead of the microwave electric power. Reference number 33 denotes an ammeter for ion current detection.

Figure 6:
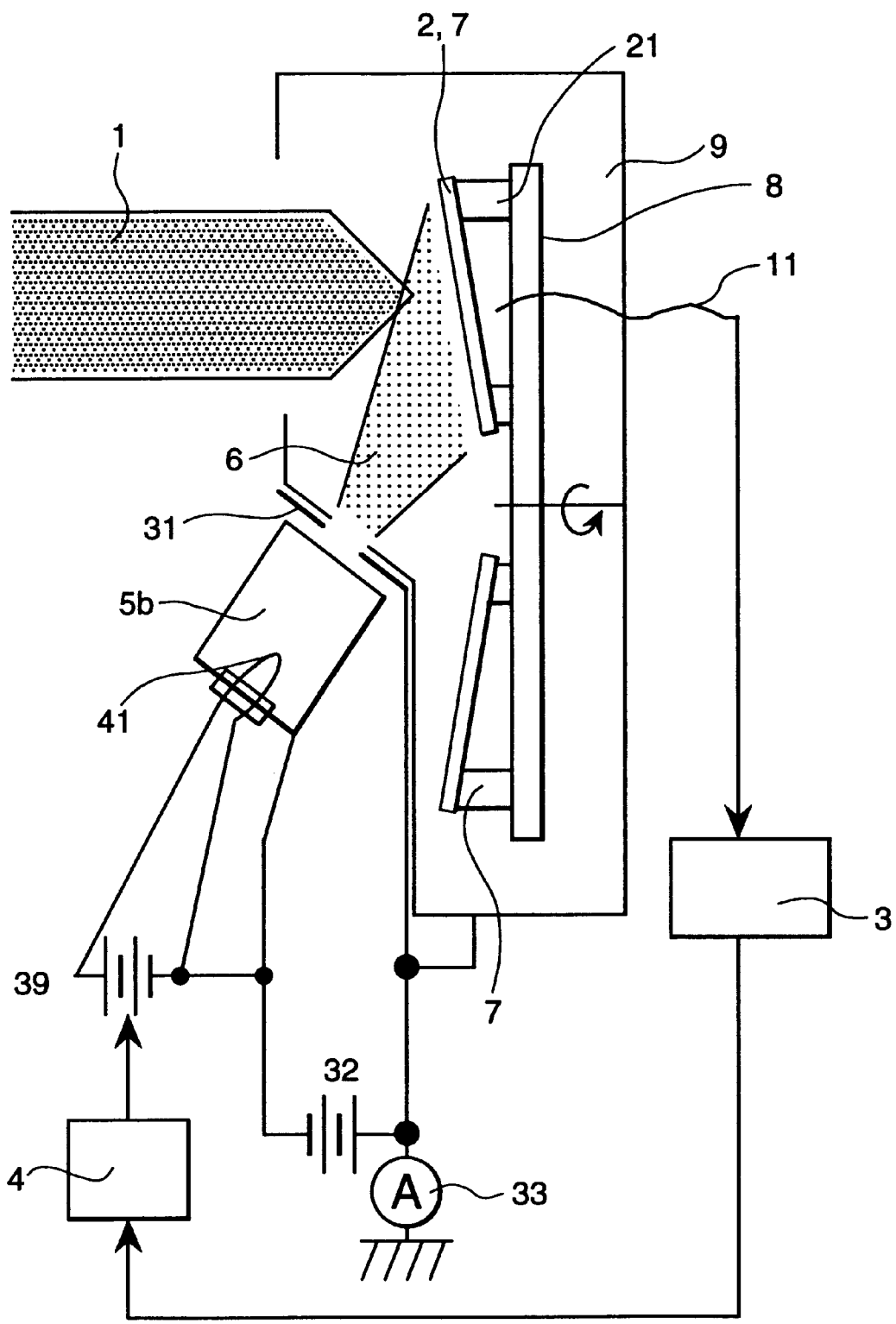
FIG. 6 is a schematic diagram of an example of an ion implanting apparatus in which a filament type electron source is used.

FIG. 6 shows a construction of an ion implanting apparatus in which electrons generated by using a thermal filament 41 of the electron source are used.

In FIG. 6, a lead wire 11 mounted on a dummy wafer 2 is led out from a Faraday cup 9 and connected to the surface electrometer 3 to measure the potential of the dummy wafer 2. Output of the surface electrometer 3 is sent to the electron source electron quantity controller 4. The controller 4 controls a filament electric power source 39 which supplies power to a filament 41 of a filament type electron source 5b, thereby to control the quantity of electrons 6 extracted from the extraction electrode 31.

Figure 7:
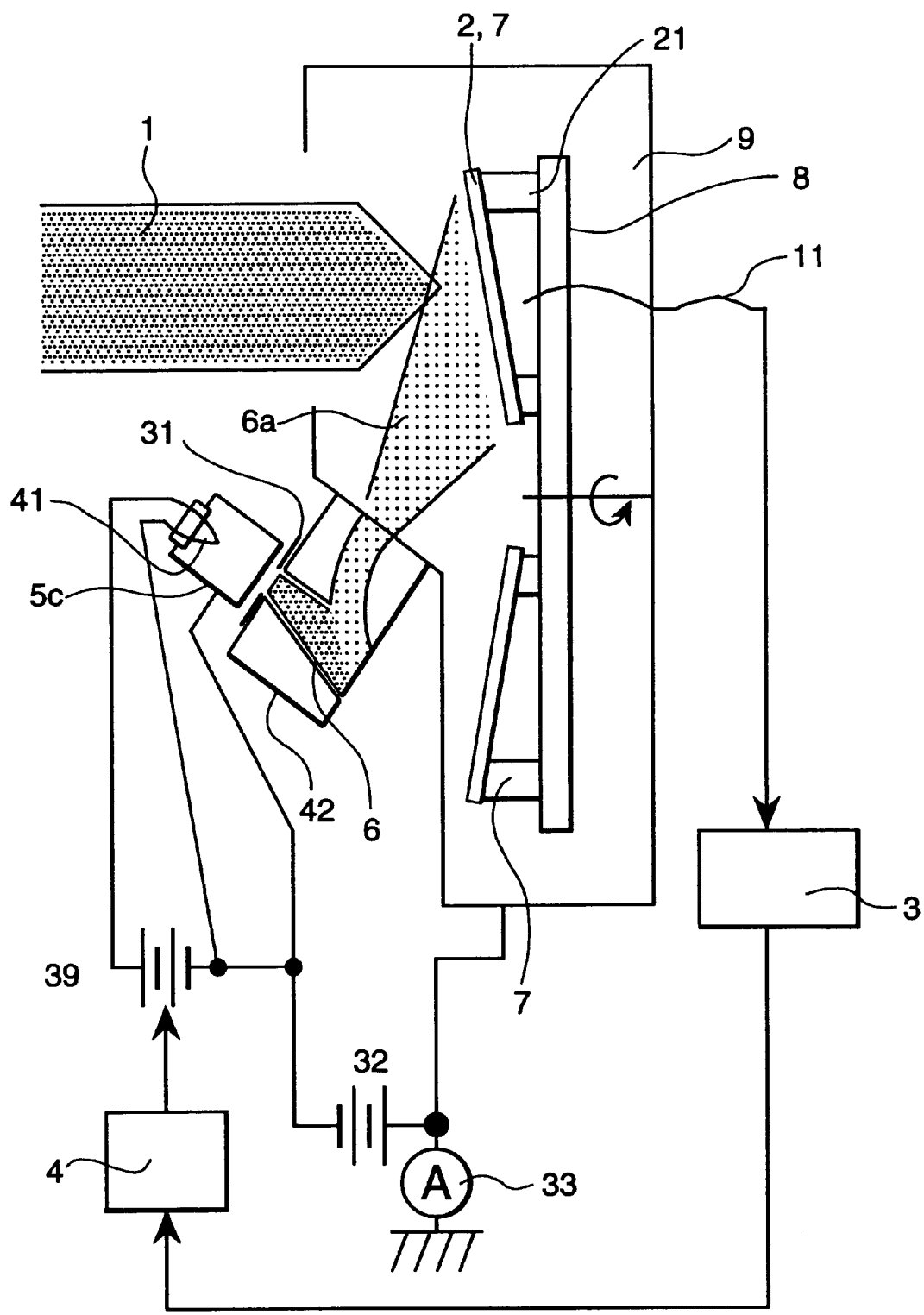
FIG. 7 is a schematic diagram of an example of an ion implanting apparatus in which an electron source of type secondary electrons by a filament is used.

FIG. 7 shows a construction of an ion implanting apparatus in which a filament type electron source 5c utilizing secondary electrons is used.

In FIG. 7, the filament type electron source 5c has a filament 41 for generating electrons. Electrons generated by the filament type electron source 5c and taken out by a taking out electrode 31 are impinged on a wall such as a secondary electron generation plate 42 to generate secondary electrons 6a. The secondary electrons 6a are irradiated onto wafers 7 and a dummy wafer 2. In this case, since the filament 41 does not directly face the wafers 7, it is possible to avoid falling of impurities from the filament 41 onto the wafers.

The quantity of secondary electrons 6a is controlled through control of the electrons 6. The control of the electrons 6 is conducted by the same apparatus as in FIG. 6 and in a manner similar to the method conducted in FIG. 6.

Further, a similar effect can be attained even if a plasma type electron source is used for primary electron generation in FIGS. 6, 7. Further, a n-type silicon wafer is described as a wafer for potential measurement, but a p-type silicon wafer can be used, which is apparent in view of the nature of the present invention. Further, the oxygen ion implanting apparatus in which a silicon wafer temperature is kept at 500° C. or higher at the time of ion beam irradiation is taken an example, but other semiconductors (including impurity introduction type) such as Ge, SiC, etc. which have substantially the same specific resistance as silicon in the above-mentioned temperature range can be used.

According to the present invention, the quantity of charge on an irradiating object at the time when ion beams are impinging on the object can be measured, so that neutralizing electrons can be precisely supplied. Further, the charge quantity can be precisely measured even at a high temperature.

What is claimed is:

1. A charge-up prevention method, comprising the following steps: when implantation ion beams are irradiated simultaneously with electrons for charge prevention on a plurality of objects to be irradiated, controlling a supply quantity of said electrons while directly measuring the potential of at least one of said objects to be irradiated during irradiation of said ion beams on said at least one object to be irradiated.

2. A charge-up prevention method according to claim 1, wherein the supply quantity of electrons is controlled so that the potential of said at least one object to be irradiated becomes 20 V or less.

3. An ion implanting apparatus which irradiates ion beams onto objects to be irradiated which are arranged in a circular shape and moving while rotating, comprising:

an electron source irradiating electrons for charge-up prevention simultaneously with irradiation of said ion beams; and a controller controlling a supply quantity of said electrons while directly measuring the potential of at least one of the objects to be irradiated during irradiation of said ion beams on the at least one object to be irradiated.

4. An ion implanting apparatus according to claim 3, further comprising a dummy wafer for potential measurement.

5. An ion implanting apparatus according to claim 3, wherein said electron source is selected from a filament type electron source producing electrons by heating a filament, an electron source emitting electrons from plasma, and an electron source producing secondary electrons by impinging electrons generated by a filament or emitted from a plasma on a wall, to use resulting secondary electrons as said electron source.

6. An ion implanting apparatus according to claim 3, wherein said controller includes a potential measuring device electrically contacted with the at least one object to be irradiated.

7. An ion implanting apparatus according to claim 3, wherein said controller includes a potential measuring device electrically contacted with the at least one object to be irradiated through a lead wire in contact with the at least one object to be irradiated.

8. An ion implanting apparatus according to claim 3, wherein said controller includes a potential measuring device that is in electrical contact with the at least one object to be irradiated through a lead wire in contact with the at least one object to be irradiated only while the rotation speed of the at least one object to be irradiated is greater than or equal to a speed sufficient for the at least one object to be irradiated to create said contact with the lead wire.

9. An ion implanting apparatus according to claim 8, further comprising a plunger to which the lead wire is electrically connected, wherein the at least one object to be irradiated moves to contact the plunger when the rotation speed is greater than or equal to said speed.

10. An ion implanting apparatus according to claim 8, further comprising a disc rotationally supporting the at least one object to be irradiated, and a spring mounted to said disc, wherein the lead wire is electrically connected to said spring, and wherein the spring moves to contact the at least one object to be irradiated when the rotation speed is greater than or equal to said speed.

* * * * *